(12) United States Patent
Kim et al.

(10) Patent No.: US 10,446,465 B2
(45) Date of Patent: Oct. 15, 2019

(54) CHIP-ON-FILM PACKAGE AND DISPLAY DEVICE INCLUDING THE SAME

(71) Applicant: Samsung Display Co., Ltd., Yongin-si, Gyeonggi-do (KR)

(72) Inventors: Eun Suk Kim, Yongin-si (KR); Moon Ju Kim, Asan-si (KR); Jin Woo Park, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/804,659

(22) Filed: Nov. 6, 2017

(65) Prior Publication Data
US 2018/0158750 A1 Jun. 7, 2018

(30) Foreign Application Priority Data

Dec. 5, 2016 (KR) .................. 10-2016-0164201

(51) Int. Cl.
*H01L 23/367* (2006.01)
*H01L 23/498* (2006.01)
(Continued)

(52) U.S. Cl.
CPC .......... *H01L 23/3675* (2013.01); *H01L 23/36* (2013.01); *H01L 23/4985* (2013.01); *H01L 24/32* (2013.01); *G09G 3/2092* (2013.01); *G09G 2320/041* (2013.01); *H01L 2224/32245* (2013.01); *H01L 2924/1426* (2013.01)

(58) Field of Classification Search
CPC .......... H01L 21/761; H01L 21/823481; H01L 27/0285; H01L 27/0629; H01L 27/092; H01L 27/0928; H01L 29/0634; H01L 29/0642; H01L 29/0692; H01L 29/1075; H01L 29/1095; H01L 29/66128; H01L 29/66681
See application file for complete search history.

(56) References Cited

U.S. PATENT DOCUMENTS 5,350,713 A * 9/1994 Liang .................... H01L 23/315
    156/245
5,475,261 A * 12/1995 Tanizawa ................ H01L 23/04
    257/692

(Continued)

FOREIGN PATENT DOCUMENTS

KR    10-2004-0031642 A    4/2004
KR    10-2010-0022613 A    3/2010
(Continued)

*Primary Examiner* — Edward Chin
(74) *Attorney, Agent, or Firm* — Innovation Counsel LLP

(57) ABSTRACT

Provided are chip-on-film package and display device including the same. The chip-on-film package comprises: a base film; a driving chip which is disposed on a surface of the base film; and a heat radiating member which is disposed on the driving chip and comprises a first heat radiating pad portion, a second heat radiating pad portion separated from the first heat radiating pad portion in a first direction, a connecting portion disposed between the first heat radiating pad portion and the second heat radiating pad portion, and one or more protrusions extending from the first heat radiating pad portion or the second heat radiating pad portion along an oblique direction in the first direction, wherein the connecting portion at least partially overlaps the driving chip.

16 Claims, 11 Drawing Sheets

(51) Int. Cl.
*H01L 23/00* (2006.01)
*H01L 23/36* (2006.01)
*G09G 3/20* (2006.01)

(56) References Cited

U.S. PATENT DOCUMENTS

| | | | | |
|---|---|---|---|---|
| 5,904,488 | A * | 5/1999 | Muramatsu | G01R 31/2884 |
| | | | | 257/E23.065 |
| 7,388,284 | B1 * | 6/2008 | Zhang | H01L 23/10 |
| | | | | 257/704 |
| 9,406,583 | B2 * | 8/2016 | Kim | H01L 23/3736 |
| 9,412,732 | B2 * | 8/2016 | Yamaji | H01L 21/761 |
| 9,975,337 | B2 * | 5/2018 | Hayashi | B41J 2/1433 |
| 2007/0290302 | A1 * | 12/2007 | Nakagawa | H01L 23/3185 |
| | | | | 257/668 |
| 2008/0258290 | A1 * | 10/2008 | Nakajima | H01L 23/4985 |
| | | | | 257/690 |
| 2014/0151794 | A1 * | 6/2014 | Lotfi | H01L 23/4824 |
| | | | | 257/337 |
| 2014/0378072 | A1 * | 12/2014 | Waldvogel | H04B 1/40 |
| | | | | 455/73 |

FOREIGN PATENT DOCUMENTS

KR 10-2014-0050831 A 4/2014
KR 10-2015-0058811 A 5/2015

* cited by examiner

CHIP-ON-FILM PACKAGE AND DISPLAY DEVICE INCLUDING THE SAME

This application claims priority to Korean Patent Application No. 10-2016-0164201, filed on Dec. 5, 2016, in the Korean Intellectual Property Office, and all the benefits accruing therefrom under 35 U.S.C. 119, the disclosure of which in its entirety is herein incorporated by reference.

BACKGROUND

1. Field

The present inventive concept relates to a chip-on-film package and a display device including the same.

2. Description of the Related Art

Generally, a display device may include a display panel and a driver for providing a driving signal to the display panel. As a method of electrically connecting the driver to the display panel, a chip-on-film package in which a driving circuit chip is mounted on a base film can be used. The chip-on-film package is advantageous in that a circuit chip can be bonded to a base film by a flip-chip bonding method and can be connected to an external circuit by a short lead, and a dense wiring pattern can be formed.

In particular, since display devices have many input and output terminals that perform various functions, are becoming smaller and thinner, and have increasing pixel density, chip-on-film package technology capable of high density integration of driving circuit chips is attracting attention.

SUMMARY

As electronic devices such as display devices become more sophisticated and miniaturized, driving circuit chips are also becoming more highly integrated. Accordingly, the increase in the integration density of circuit chips has led to the demand for a technology that can reduce heat density by more effectively removing and/or dissipating heat generated from circuit chips.

Aspects of the inventive concept provide a chip-on-film package which is structured to effectively remove and/or dissipate heat generated from a driving circuit chip.

Aspects of the inventive concept also provide a display device which minimizes defects such as noise and has improved reliability by effectively removing heat generated from a driving circuit chip.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

According to an exemplary embodiment of the inventive concept, there is provided a chip-on-film package. The chip-on-film package comprises: a base film; a driving chip which is disposed on a surface of the base film; and a heat radiating member which is disposed on the driving chip and comprises a first heat radiating pad portion, a second heat radiating pad portion separated from the first heat radiating pad portion in a first direction, a connecting portion disposed between the first heat radiating pad portion and the second heat radiating pad portion, and one or more protrusions extending from the first heat radiating pad portion or the second heat radiating pad portion along an oblique direction in the first direction, wherein the connecting portion at least partially overlaps the driving chip.

In an exemplary embodiment, the base film may comprise a channel portion which overlaps the driving chip, a first terminal portion which is disposed on a side of the channel portion in a second direction intersecting the first direction, and a second terminal portion which is disposed on the other side of the channel portion in the second direction.

In an exemplary embodiment, the base film may have a first vertex which is disposed on one side of the first terminal portion to be adjacent to the first heat radiating pad portion and a second vertex which is disposed on the other side of the first terminal portion to be adjacent to the second heat radiating pad portion, and the protrusions may comprise a first protrusion which extends from the first heat radiating pad portion toward the first vertex of the base film and a second protrusion which extends from the second heat radiating pad portion toward the second vertex of the base film.

In an exemplary embodiment, the protrusions may further comprise a third protrusion which extends from the first heat radiating pad portion toward the second vertex of the base film and a fourth protrusion which extends from the second heat radiating pad portion toward the first vertex of the base film, wherein an extension length of the first protrusion may be the same as an extension length of the second protrusion, and an extension length of the third protrusion may be the same as an extension length of the fourth protrusion.

In an exemplary embodiment, the protrusions may extend from the first heat radiating pad portion toward any vertex of the base film, and an extension length of the protrusions may be $1/3$ or more of a length from the first heat radiating pad portion to the vertex of the base film.

In an exemplary embodiment, the extension length of the protrusions may be greater than a width of the first heat radiating pad portion in the second direction.

In an exemplary embodiment, a width of the connecting portion in the second direction may be greater than a width of the driving chip in the second direction.

In an exemplary embodiment, a width of the driving chip in the first direction may be greater than the width of the driving chip in the second direction, a length of the connecting portion in the first direction may be smaller than the width of the driving chip in the first direction, and the first heat radiating pad portion and the second heat radiating pad portion at least partially overlap the driving chip.

In an exemplary embodiment, a surface of the connecting portion may be disposed at a level higher than a surface of the first heat radiating pad portion and a surface of the second heat radiating pad portion based on the surface of the base film.

In an exemplary embodiment, the surface of the connecting portion may be partially inclined.

In an exemplary embodiment, a predetermined gap may be formed between a side surface of the driving chip and the heat radiating member.

In an exemplary embodiment, a length from the driving chip to an edge of the first terminal portion of the base film may be smaller than a length from the driving chip to an edge of the second terminal portion of the base film.

In an exemplary embodiment, the protrusions may comprise a first protrusion which extends from the first heat radiating pad portion toward the first terminal portion of the base film and a second protrusion which extends from the first heat radiating pad portion toward the second terminal portion of the base film, wherein an extension length of the first protrusion may be smaller than an extension length of the second protrusion.

In an exemplary embodiment, the chip-on-film package may further comprise an adhesive layer which is interposed between the driving chip and the heat radiating member, wherein the adhesive layer is in contact with the base film, the driving chip, and the heat radiating member.

According to another exemplary embodiment of the inventive concept, a chip-on-film package comprise: a base film; a driving chip which is disposed on the base film; and a metal plate which is disposed on the driving chip to overlap the driving chip, wherein the metal plate comprises: a body portion; and a plurality of protrusions which extend radially from the body portion.

In an exemplary embodiment, an edge of the body portion may have an inwardly recessed portion.

According to an exemplary embodiment of the inventive concept, there is provided a display device. The display device comprise: a display panel; a printed circuit board on which a driving circuit for driving the display panel is mounted; and a chip-on-film package which electrically connects the display panel and the printed circuit board, wherein the chip-on-film package comprises: a base film; a driving chip which is disposed on a surface of the base film; and a heat radiating member which is disposed on the driving chip and comprises a body portion and one or more protrusions extending from corners of the body portion.

In an exemplary embodiment, the body portion may include a recess portion recessed from an edge of the body portion toward the driving chip.

In an exemplary embodiment, the protrusions may extend from the corners of the body portion toward opposing corners of the base film.

In an exemplary embodiment, the base film may comprise an input terminal portion which is connected to the printed circuit board and receives a driving signal from the driving circuit and an output terminal portion which is connected to the display panel and outputs the driving signal, and the protrusions may comprise a first protrusion which extends from the body portion toward an input terminal portion of the base film and a second protrusion which extends from the body portion toward an output terminal portion of the base film, wherein an extension length of the first protrusion may be smaller than an extension length of the second protrusion.

In a chip-on-film package according to an embodiment, a heat radiating member is disposed on a driving chip. Therefore, heat generated from the driving chip can be effectively removed and/or dissipated. In addition, since the heat radiating member includes a body portion and one or more protrusions extending from the body portion, a warping defect of the chip-on-film package can be suppressed.

Furthermore, since the heat generated from the driving chip is effectively removed and/or dissipated while the warping defect of the chip-on-film package is suppressed, a display device with improved reliability can be provided.

The effects of the present disclosure are not limited to the above-described effects and other effects which are not described herein will become apparent to those skilled in the art from the following description.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
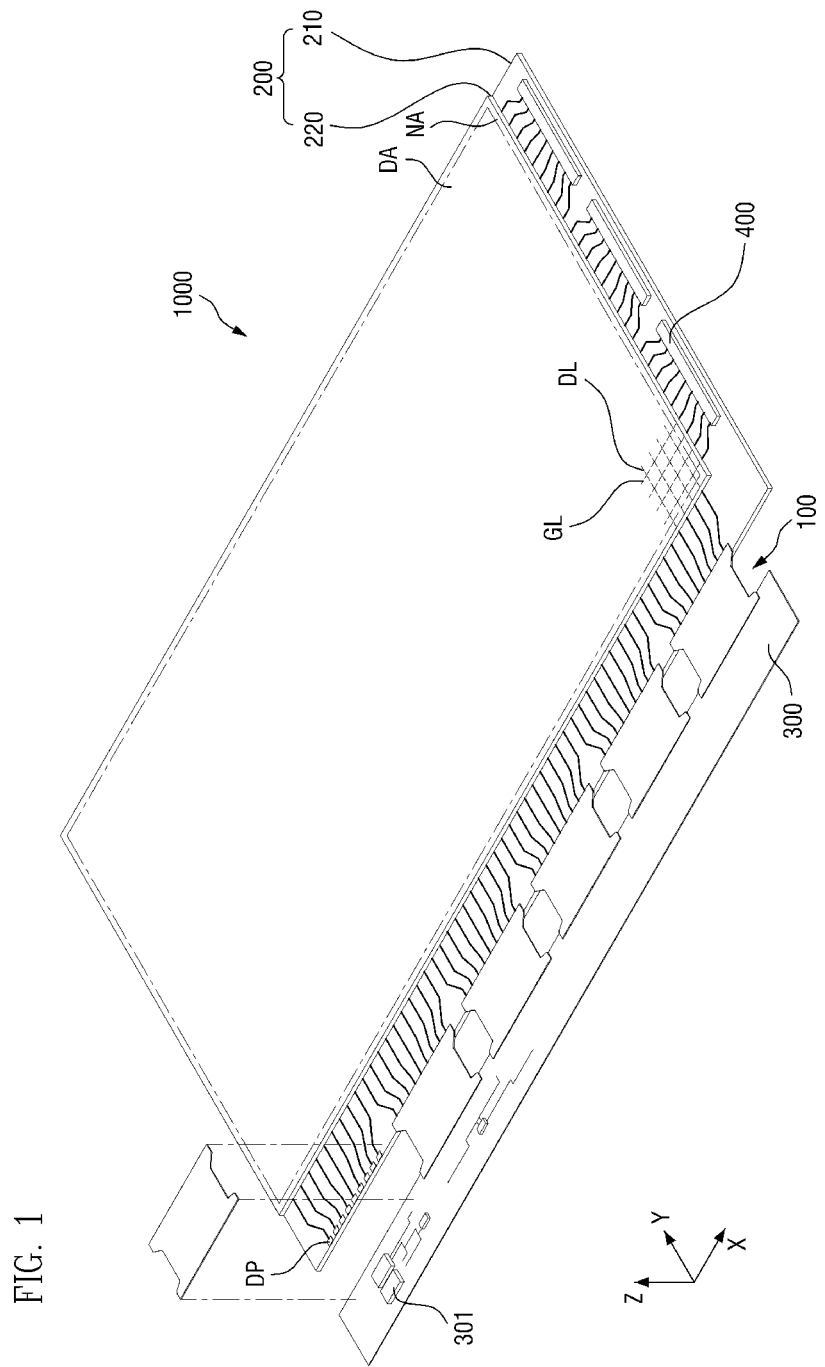
FIG. 1 is a perspective view of a display device according to an embodiment.

Features of the inventive concept and methods of accomplishing the same may be understood more readily by reference to the following detailed description of preferred embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other.

Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) end the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof. "At least one" is not to be construed as limiting "a" or "an." "Or" means "and/or." As used herein, the term "and/or" includes any and all combinations of one or more of the associated listed items.

In the present specification, a first direction X is any direction in a plane, a second direction Y is a direction intersecting the first direction X in the plane, and a third direction Z is a direction perpendicular to the plane.

Hereinafter, embodiments of the inventive concept will be described with reference to the accompanying drawings.

Figure 2:
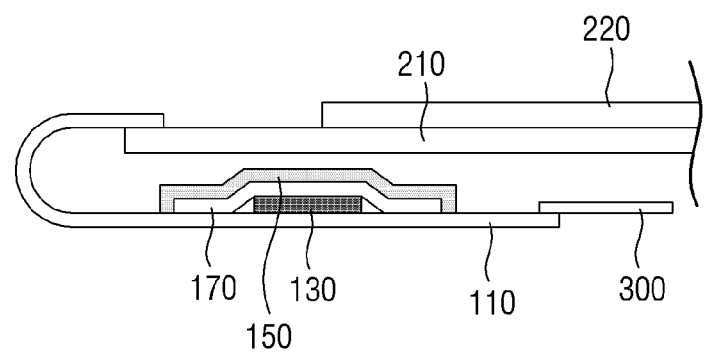
FIG. 2 is a side cross-sectional view illustrating a state in which a chip-on-film package of the display device of FIG. 1 is curved.
Figure 3:
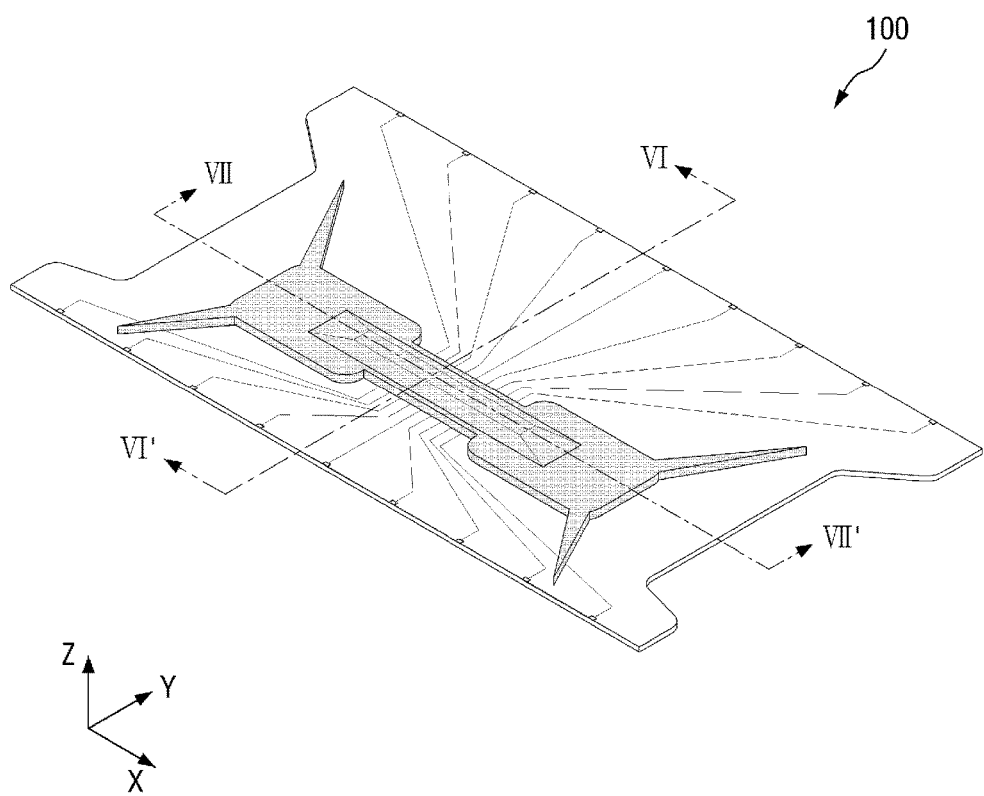
FIG. 3 is a bottom perspective view of the chip-on-film package of e display device of FIG. 1.
Figure 4:
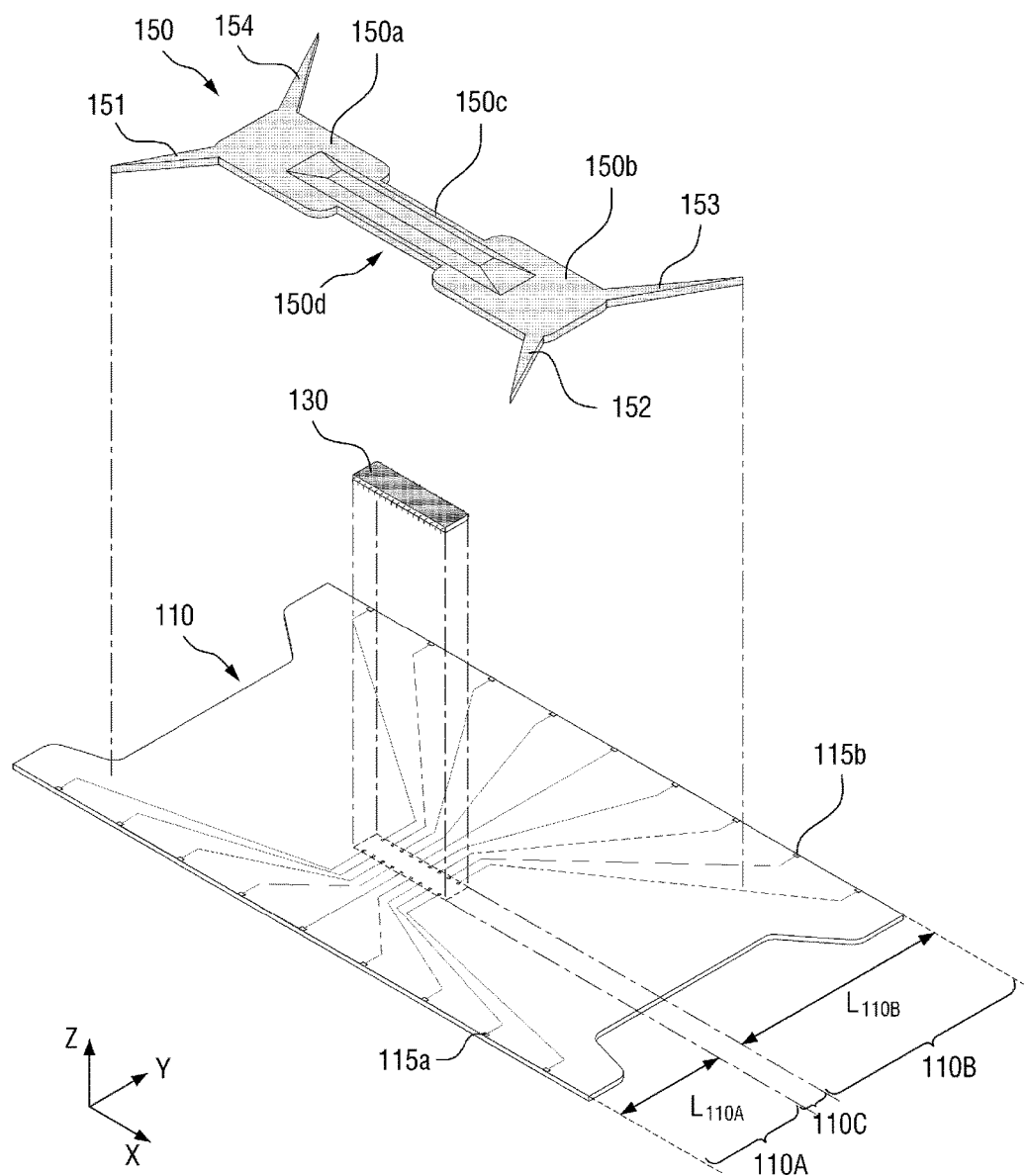
FIG. 4 is an exploded perspective view of the chip-on-film package of FIG. 3.
Figure 5:
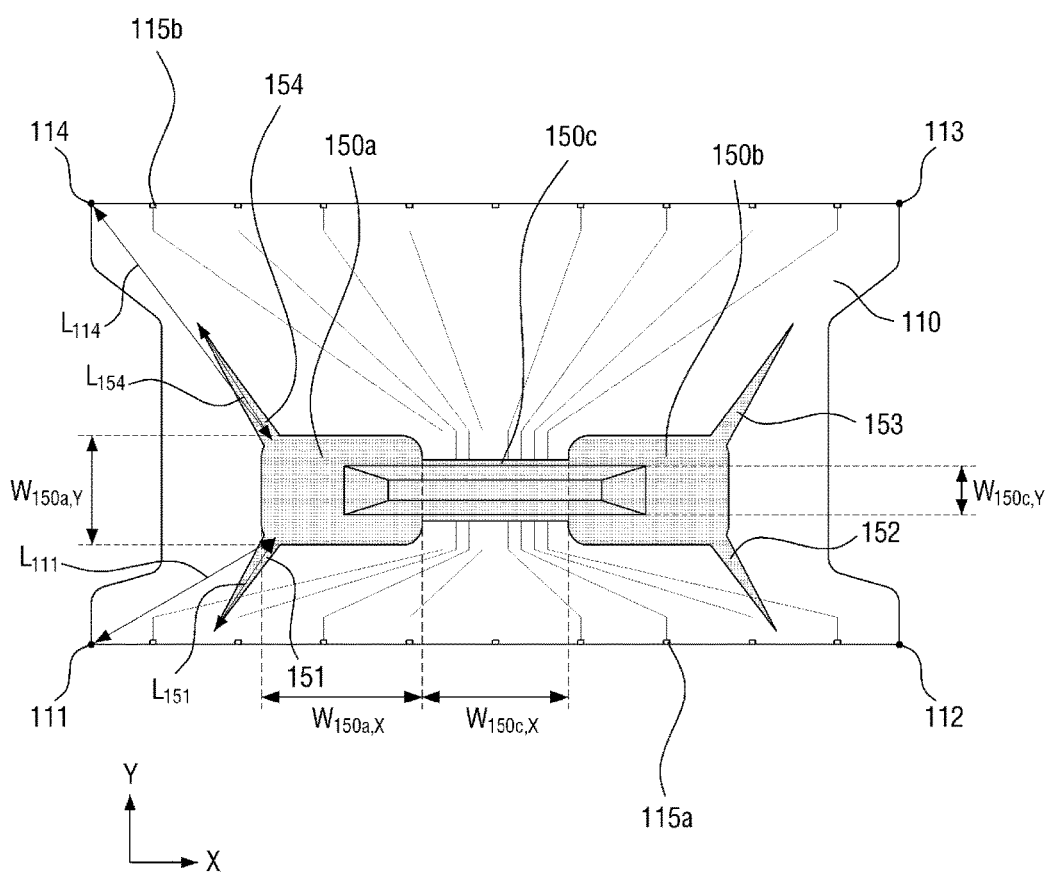
FIG. 5 is a plan view of the chip-on-film package of FIG. 3.
Figure 6:
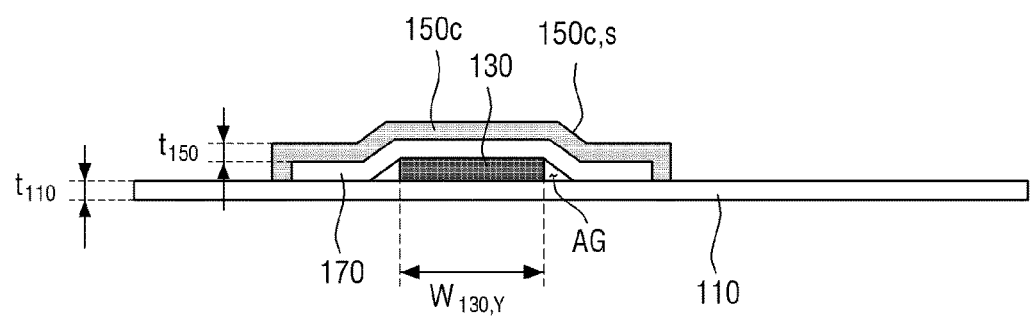
FIG. 6 is a cross-sectional view taken along the line VI-VI' of FIG. 3.
Figure 7:
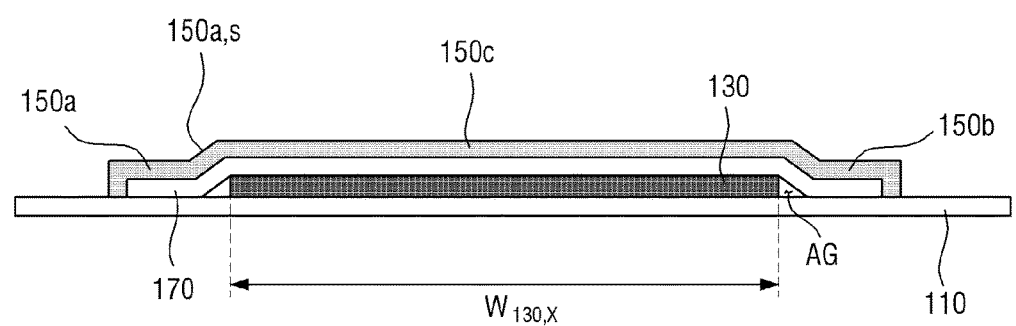
FIG. 7 is a cross-sectional view taken along the line VII-VII' of FIG. 3.

FIG. 1 is a perspective view of a display device 1000 according to an embodiment. FIG. 2 is a side cross-sectional view illustrating a state in which a chip-on-film package 100 of the display device 1000 of FIG. 1 is curved. FIG. 3 is a bottom perspective view of the chip-on-film package 100 of the display device 1000 of FIG. 1. FIG. 4 is an exploded perspective view of the chip-on-film package 100 of FIG. 3. FIG. 5 is a plan view of the chip-on-film package 100 of FIG. 3. FIG. 6 is a cross-sectional view taken along the line VI-VI' of FIG. 3. FIG. 7 is a cross-sectional view taken along the line VII-VII' of FIG. 3. Referring to FIGS. 1 through 7, the display device 1000 according to the current embodiment includes a display panel 200 which displays an image, an external driving circuit portion 300 which provides a driving signal to the display panel 200, and the chip-on-film package 100 which electrically connects the display panel 200 and the external driving circuit portion 300.

The display panel 200 is not particularly limited as long as it can display an image in response to a drive signal received from an external source. For example, the display panel 200 may be a liquid crystal display panel, an electrophoretic display panel, an organic light emitting diode panel, a plasma display panel, or the like.

The display panel 200 may include a first substrate 210 and a second substrate 220. In an embodiment, the first substrate 210 may be a thin film transistor substrate having a switching element (not illustrated) for controlling the switching of a pixel electrode of each pixel and gate lines GL and data lines DL for delivering driving signals, and the second substrate 220 may be an upper substrate. The planar area of the first substrate 210 may be larger than that of the second substrate 220. In another embodiment, the first substrate 210 may be an upper substrate, and the second substrate 220 may be a lower substrate.

In the display panel 200, a display area DA and a non-display area. NA may be defined. The display area DA is an area in which a plurality of pixels for displaying an image are disposed and an image is displayed, and the non-display area NA is an area in which no image is displayed. Each of the pixels may uniquely display one of primary colors to implement color display. Examples of the primary colors include red, green and blue.

The pixels may be arranged in the first direction X and the second direction Y in a substantially matrix configuration. For example, one gate line GL may deliver a gate driving signal to a plurality of pixels arranged along the first direction X, and one data line DL may deliver a data driving signal to a plurality of pixels arranged along the second direction Y. Each of the gate and data lines GL and DL may extend from the display area DA to the non-display area NA and receive a driving signal from a driver.

The non-display area NA may be a light shielding area. The non-display area NA may surround the display area DA when seen in plan view. In an embodiment, a data pad portion DP required for electrical connection to the chip-on-film package 100 and a gate driver 400 may be disposed on the first substrate 210 in the non-display area NA. In FIG. 1, a chip-on-glass structure in which the gate driver 400 is disposed directly on the first substrate 210 is illustrated as an example. In another embodiment, the gate driver 400, like a data driver, may be connected to the display panel 200 by the chip-on-film package. Alternatively, circuits constituting the gate driver 400 may be formed directly on the first substrate 210. Alternatively, the above methods may be used in combination.

The external driving circuit portion 300 may be electrically connected to the chip-on-film package 100. In an embodiment, the external driving circuit portion 300 may be a printed circuit board. The external driving circuit portion 300 may include a driving circuit 301 which generates or transmits driving signals for driving the display panel 200. For example, the driving signals may include a data driver control signal for controlling a driving chip 130 of the chip-on-film package 100, a gate driver control signal for controlling the gate driver 400, and an image data signal.

The chip-on-film package 100 may transmit the above driving signals received from the external driving circuit portion 300 to the display panel 200. That is, the chip-on-film package 100 may electrically connect the external driving circuit portion 300 and the display panel 200. For example, the chip-on-film package 100 may transmit the driving signal-based data signal to the display panel 300. The chip-on-film package 100 may be repeatedly placed along the first direction X and thus provided in a plurality. In an embodiment, the chip-on-film package 100 includes a base film 110, the driving chip 130 disposed on the base film 110, and a heat radiating member 150 disposed on the driving chip 130. Based on FIG. 1, the driving chip 130 and the heat radiating member 150 may be disposed on a bottom surface (rear surface) of the base film 110. In another embodiment, the driving chip 130 and the heat radiating member 150 may be disposed on a top surface of the base film 110.

The base film 110 may be an insulating film. In some embodiments, the base film 110 may be flexible film. For example, the base film 110 may include polyimide, polyester, polyepoxy, or the like.

The base film 110 may include a channel portion 110C, a first terminal portion 110A located on a side of the channel portion 110C in the second direction Y, and a second terminal portion 110B located on the other side of the channel portion 110C in the second direction Y The channel portion 110C may be an area on which the driving chip 130 is disposed. A bus line extending from the first terminal portion 110A and a bus line extending from the second terminal portion 110B may be separated from each other with the channel portion 110C interposed between them. A first pad portion 115a is disposed close to an edge of the first terminal portion 110A, and a second pad portion 115b is disposed close to an edge of the second terminal portion 110B. In an embodiment, the first terminal portion 110A may be an input terminal portion directly connected to the external driving circuit portion 300 to receive a driving signal, and the second terminal portion 110B may be an output terminal portion directly connected to the display panel 200 to output the driving signal.

The base film 110 may have first through fourth vertices 111 through 114. The first vertex 111 is located on the side of the first terminal portion 110A to be adjacent to a first heat radiating pad portion 150a, the second vertex 112 is located on the side of the first terminal portion 110A to be adjacent to a second heat radiating pad portion 150b, the third vertex 113 is located on the side of the second terminal portion 110B to be adjacent to the second heat radiating pad portion 150b, and the fourth vertex 114 is located on the side of the second terminal portion 110B to be adjacent to the first heat radiating pad portion 150a.

The driving chip 130 may be disposed on the channel portion 110C of the base film 110. In an embodiment, the driving chip 130 may be a data driving integrated circuit. The driving chip 130 may be the data driver which receives a data driver control signal and generates a data driving signal in response to the data driver control signal. For example, the driving chip 130 may generate a data driving signal in response to the data driver control signal received from the external driving circuit portion 300 through the first pad portion 115a of the base film 110 and output the data driving signal to the second pad portion 115b. A width $W_{130,X}$ of the driving chip 130 in the first direction X may be greater than a width $W_{130,Y}$ of the driving chip 130 in the second direction Y In this specification, a width and a length respectively refer to a width and a length obtained by measuring a shortest distance between two points in plan view. In some embodiments, a length $L_{110A}$ from the driving chip 130 to the edge of the first terminal portion 110A of the base film 110 may be smaller than a length $L_{110B}$ from the driving chip 130 to the edge of the second terminal portion 110B of the base film 110.

The heat radiating member 150 may be disposed on the driving chip 130. The heat radiating member 150 may be a heat transfer member made of a material having a relatively high thermal conductivity. For example, the heat radiating member 150 may be a metal plate made of aluminum, copper, silver, gold, or an alloy of these materials. The heat radiating member 150 may contact the driving chip 130 directly or indirectly with an adhesion layer disposed between the heat radiation member 150 and the driving chip and is disposed adjacent to the driving chip 130 so as to effectively absorb and dissipate heat generated from the driving chip 130. Accordingly, noise is minimized, which, in turn, improves display quality and reliability of the display device 1000. A thickness $t_{150}$ of the heat radiating member 150 is substantially; uniform and may be greater than a thickness $t_{110}$ of the base film 110. A thickness $t_{150}$ of the heating radiating member 150 may be about 30 μm to about 100 μm, or about 40 μm to about 60 μm.

The heat radiating member 150 may include a body portion (150a through 150c) and one or more protrusions 151 through 154 extending from the body portion (150a through 150c). The body portion (150a through 150c) may be a portion that performs a main heat dissipation function. The body portion (150a through 150c) may at least partially overlap the driving chip 130. The planar area of the body portion (150a through 150c) may be larger than the planar area of the driving chip 130, and the body portion (150a through 150c) of the heat radiating member 150 may completely cover the driving chip 130 in plan view so that the driving chip 130 is completely embedded in the heat radiating member 150. The body portion (150a through 150c) may occupy most of the planar area of the heat radiating member 150. For example, the planar area occupied by the body portion (150a through 150c) may be about 60% or more, about 70% or more, or about 80% or more of the planar area of the heat radiating member 150.

In an embodiment, the body portion (150a through 150c) of the heat radiating member 150 may include the first heat radiating pad portion 150a, the second heat radiating pad portion 150b separated from the first heat radiating pad portion 150a in the first direction X, and a connecting portion 150c disposed between the first heat radiating pad portion 150a and the second heat radiating pad portion 150. In another aspect, an edge of the body portion (150a through 150c) of the heat radiating member 150 may have an inwardly recessed portion 150d which correspond to a long side of the driving chip 130 For example, an edge of the heat radiating member 150 extending in the first direction X may be at least partially recessed in the second direction Y to form the recessed portion 150d.

Each of the first heat radiating pad portion 150a and the second heat radiating pad portion 150b may be in the form of a pad having a predetermined planar area. In FIG. 3, each of the first heat radiating pad portion 150a and the second heat radiating pad portion 150b is shaped like a substantial quadrilateral having each vertex chamfered. However, the shape of each of the first heat radiating pad portion 150a and the second heat radiating pad portion 150b is not limited to the example of FIG. 3. Each of the first heat radiating pad portion 150a and the second heat radiating pad portion 150b can also have other polygonal shapes, or an edge of the first heat radiating pad portion 150a or the second heat radiating pad portion 150 can include a curve. The planar shapes of the first heat radiating pad portion 150a and the second heat radiating pad portion 150b may be substantially the same or different. In plan view, the first heat radiating pad portion 150a and the second heat radiating pad portion 150b may at least partially overlap the driving chip 130.

The connecting portion 150c may be disposed between the first heat radiating pad portion 150a and the second heat radiating pad portion 150b to connect the first heat radiating pad portion 150a and the second heat radiating pad portion 150b. The connecting portion 150c may be integrally formed with the first heat radiating pad portion 150a and the second heal radiating pad portion 150b using a same material without physical boundary. In plan view, the connecting portion 150c may at least partially overlap the driving chip 130. In an embodiment, a length $W_{150c,X}$ of the connecting portion 150c in the first direction X may be smaller than the width $W_{130,X}$ of the driving chip 130 in the first direction X. In addition, a width $W_{150c,Y}$ of the connecting portion 150c in the second direction Y may be greater than the width $W_{130,Y}$ of the driving chip 130 in the second direction Y. Heat dissipation characteristics of the heat radiating member 150 can be improved by securing a sufficient overlap area between the connecting portion 150c and the driving chip 130.

The first heat radiating pad portion 150a and the second heat radiating pad portion 150b may be extended portions as compared with the connecting portion 150c. That is, the body portion (150a through 150c) of the heat radiating member 150 may be in the form of a dumbbell that is substantially horizontally symmetrical in plan view. For example, a width $W_{150a,Y}$ of each of the first heat radiating pad portion 150a and the second heat radiating pad portion 150b in the second direction Y may be greater than the width $W_{150c,Y}$ of the connecting portion 150c in the second direction Y. Since each of the first heat radiating pad portion 150a and the second heat radiating pad portion 150b is formed wider than the connecting portion 150c to occupy a relatively large area, the adhesion between the heat radiating member 150 and the base film 110 can be increased, thereby improving durability of the chip-on-film package 100. The connecting portion 150c may correspond to a recessed portion described above.

In addition, a surface (an upper surface in a cross-sectional view) of the connecting portion 150c may be located at a level higher than a surface (an upper surface in the cross-sectional view) of the first heat radiating pad portion 150a and a surface of the second heat radiating pad portion 150b based on a surface of the base film 110.

In an embodiment, the surface of the connecting portion 150c may be at least partially inclined. For example, the surface of the connecting portion 150c may have a sloping portion 150c,s inclined downward along the second direction Y. In addition, each of the surface of the first heat radiating pad portion 150a and the surface of the second heat radiating pad portion 150b may be at least partially inclined. For example, each of the surface of the first heat radiating pad portion 150a and the surface of the second heat radiating pad portion 150b may have a sloping portion 150a,s inclined downward along the first direction X.

All side surfaces of the driving chip 130 may be covered by the heat radiating member 150 and may not be exposed to the outside. That is, the side surfaces of the driving chip 130 may face the other surface (a lower surface in the cross-sectional view) of the heat radiating member 150. Therefore, the heat dissipation characteristics of the heat radiating member 150 can be maximized. In an embodiment, a predetermined gap AG may be formed between each side surface of the driving chip 130 and the heat radiating member 150. The predetermined gap AG may be an air gap. Therefore, the driving chip 130 and the heat radiating member 150 may be at least partially separated from each other. For example, at least part of a side surface of the driving chip 130 and the sloping portion 150a,s of the first heat radiating pad portion 150a may be separated from each other in the first direction X and partially face each other with the gap AG formed between them. In addition, at least part of a side surface of the driving chip 130 and the sloping portion 150c,s of the connecting portion 150c may be separated from each other in the second direction Y and partially face each other with the gap AG formed between them.

The protrusions 151 through 154 of the heat radiating member 150 may be portions extending from the body portion (150a through 150c) of the heat radiating member 150 along an oblique direction in the first direction and in the second direction. For example, each of the protrusions 151 through 154 may extend from the first heat radiating pad portion 150a or the second heat radiating pad portion 150b of the body portion (150a through 150c). The protrusions 151 through 154 may be integrally formed with the body portion (150a through 150c) without physical boundary.

In an embodiment, the protrusions 151 through 154 may include the first protrusion 151 extending from the first heat radiating pad portion 150a toward the first vertex 111 of the base film 110, the second protrusions 152 extending from the second heat radiating pad portion 150b toward the second vertex 112 of the base film 110, the third protrusion 153 extending from the second heat radiating pad portion 150b toward the third vertex 113 of the base film 110, and the fourth protrusion 154 extending from the first heat radiating pad portion 150a toward the fourth vertex 114 of the base film 110. That is, the protrusions 151 through 154 may include the first protrusion 151 and the second protrusion 152 extending from the body portion (150a through 150c) toward the first terminal portion 110A and the third protrusion 153 and the fourth protrusion 154 extending from the body portion (150a through 150c) toward the second terminal portion 110B. The protrusions 151 through 154 may be formed substantially radially in plan view. By forming one or more protrusions 151 through 154 extending in directions intersecting both the first direction X and the second direction Y, it is possible to prevent the base film 110 from being warped or twisted by the adhesion between the heat radiating member 150 and the base film 110. In FIG. 3, each of the protrusions 151 through 154 gradually becomes narrower as it extends. However, the inventive concept is not limited to this case. In an embodiment, each of the protrusions 151 through 154 can also gradually become thinner as it extends.

In an embodiment, an extension length $L_{151}$ of the first protrusion 151 may be about ⅓ or more or about ½ or more of a length $L_{111}$ (a shortest distance) from the first radiating pad portion 150a to the first vertex 111, or the first protrusion 151 may extend up to the first vertex 111. In some embodiment, the extension length $L_{151}$ of the first protrusion 151 may be greater than the width $W_{150a,X}$ of the first heat radiating pad portion 150a in the first direction X or the width $W_{150a,Y}$ of the first heat radiating pad portion 150a in the second direction Y.

Likewise, an extension length of the second protrusion 152 may be about ⅓ or more of a length from the second heat radiating pad portion 150b to the second vertex 112 and may be greater than a width of the second heat radiating pad portion 150b in the first direction X and a width of the second heat radiating pad portion 150b in the second direction Y. In addition, an extension length of the third protrusion 153 may be about ⅓ or more of a length from the second radiating pad portion 150b to the third vertex 113 and may be greater than e width of the second heat radiating pad portion 150b in the first direction X and the width of the second heat radiating pad portion 150b in the second direction Y. In addition, an extension length $L_{154}$ of the fourth protrusion 154 may be about ⅓ or more of a length $L_{114}$ from the first heal radiating pad portion 150a to the fourth vertex 114 and may be greater than the width $W_{150a,X}$ of the first heat radiating pad portion 150a in the first direction X and the width $W_{150a,Y}$ of the first heat radiating pad portion 150a in the second direction Y.

In an embodiment, the extension length $L_{151}$ of the first protrusion 151 may be smaller than the extension length $L_{154}$ of the fourth protrusion 154, and the extension length of the second protrusion 152 may be smaller than the extension length of the third protrusion 153. The extension length $L_{151}$ of the first protrusion 151 and the extension length of the second protrusion 152 may be substantially the same or different, and the extension length of the third protrusion 153 and the extension length $L_{154}$ of the fourth protrusion 154 may be substantially the same or different.

In some embodiments, the chip-on-film package 100 may further include an adhesive layer 170 interposed between the driving chip 130 and the heat radiating member 150. The adhesive layer 170 may be a layer that couples the heat radiating member 150 onto the driving chip 130 and the base film 110. For example, the adhesive layer 170 may include a material having viscosity or adhesive strength. The adhesive layer 170 may be partially contact with a surface (upper surface in the drawing) of the base film 110, a surface (upper surface in the drawing) of the driving chip 130, and the other surface of the heat radiating member 150. The adhesive layer 170 may include curable resin or pressure sensitive adhesive.

The heat radiating member 150 may at least partially be in direct contact with the base film 110. For example, edge portions of the heat radiating member 150 may be in direct contact with the base film 110. That is, side surfaces of the adhesive layer 170 may be covered by the heat radiating member 150 and may not be exposed to the outside.

In an embodiment, the chip-on film package 100 of the display device 1000 may be in a curved state. For example, the chip-on-film package 100 may be curved along the second direction Y toward a back surface of the first substrate 210. In this case, a surface of the base film 110 on which the driving chip 130 and the heat radiating member 150 are disposed may form a concave surface, and the other surface of the base film 110 may form a convex surface. The heat radiating member 150 disposed on the base film 110 may face the back surface of the first substrate 210. Since the external driving circuit portion 300 having a predetermined area is placed over the display panel 200 by bending the chip-on-film package 100, the size of the display device 1000 can be further reduced.

In addition, since the distance from the first terminal portion 110A directly connected to the external driving circuit portion 300 to the driving chip 130 is smaller than the distance from the second terminal portion 110B directly connected the display panel 200 to the driving chip 130, the heat radiating member 150 can be prevented from being displaced or peeling off from the base film 110 even when the chip-on-film package 100 is curved.

Hereinafter, chip-on-film packages according to embodiments will be described. A description of the same or similar components as those of the above-described chip-on-film package will be omitted, and the same or similar components will be clearly understood from the accompanying drawings by those skilled in the art.

Figure 8:
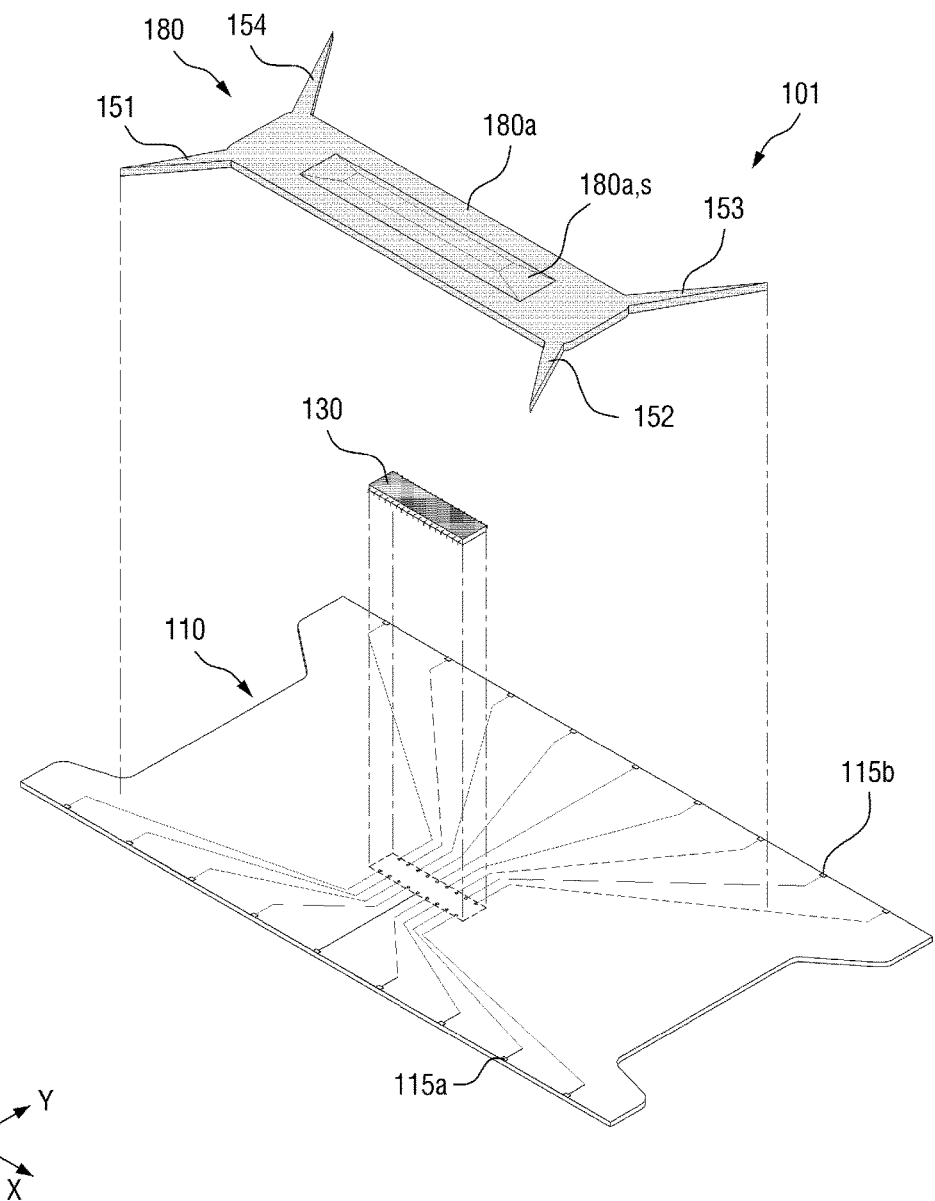
FIG. 8 is an exploded perspective view of a chip-on-film package according to another embodiment.
Figure 9:
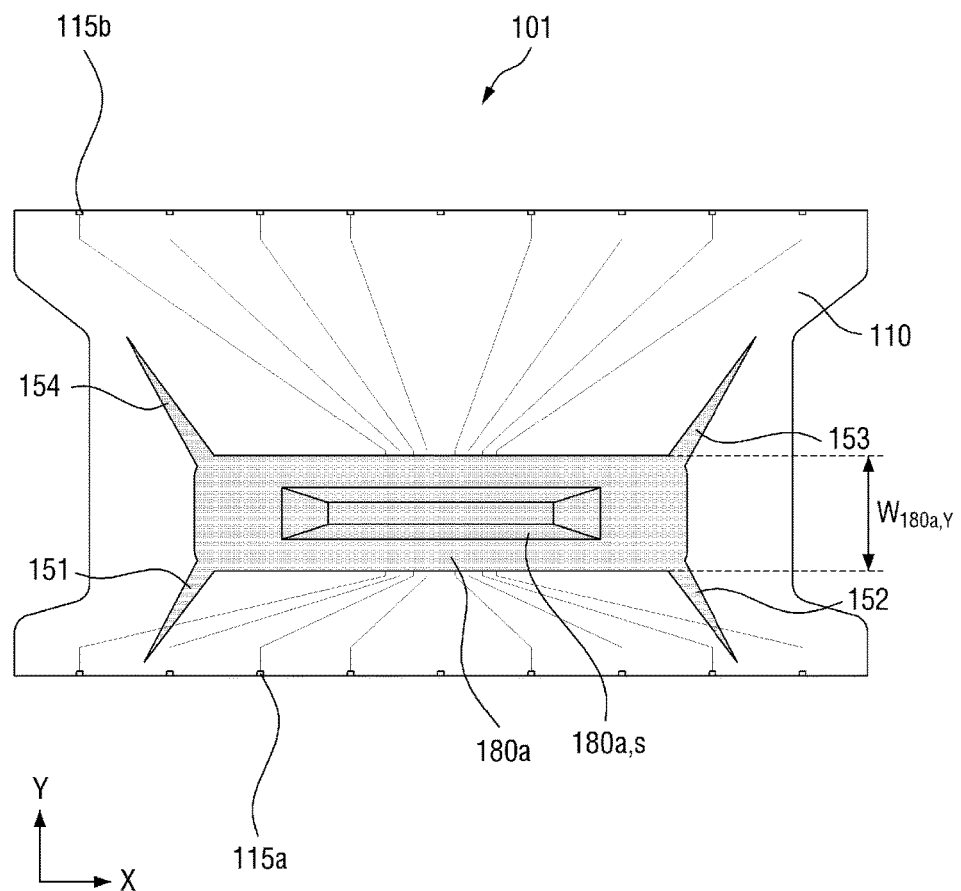
FIG. 9 is a plan view of the chip-on-film package of FIG. 8.

FIG. 8 is an exploded perspective view of a chip-on-film package 101 according to another embodiment. FIG. 9 is a plan view of the chip-on-film package 101 of FIG. 8.

Referring to FIGS. 8 and 9, a heat radiating member 180 of the chip-on-film package 101 according to the current embodiment includes a body portion 180a and one or more protrusions 151 through 154 extending from the body portion 180a. However, the chip-on-film package 101 according to the current embodiment is different from the chip-on-film package 100 according to the embodiment of FIG. 3 in that an edge of the body portion 180a does not have a recessed portion.

That is, the body portion 180a may have a substantially uniform width $W_{180a,Y}$ in the second direction Y without having extended portions, unlike the heat radiating member 150 of FIG. 3. The body portion 180a may form a heat radiating pad portion by itself.

In an embodiment, a surface (upper surface) of the body portion 180a may be at least partially inclined. For example, the surface of the body portion 180a may have a sloping portion 180a,s inclined downward along the first direction X and the second direction Y. In addition, an extension length of each of the projections 151 through 154 may be greater than the width $W_{180a,Y}$ of the body portion 180a in the second direction Y.

Figure 10:
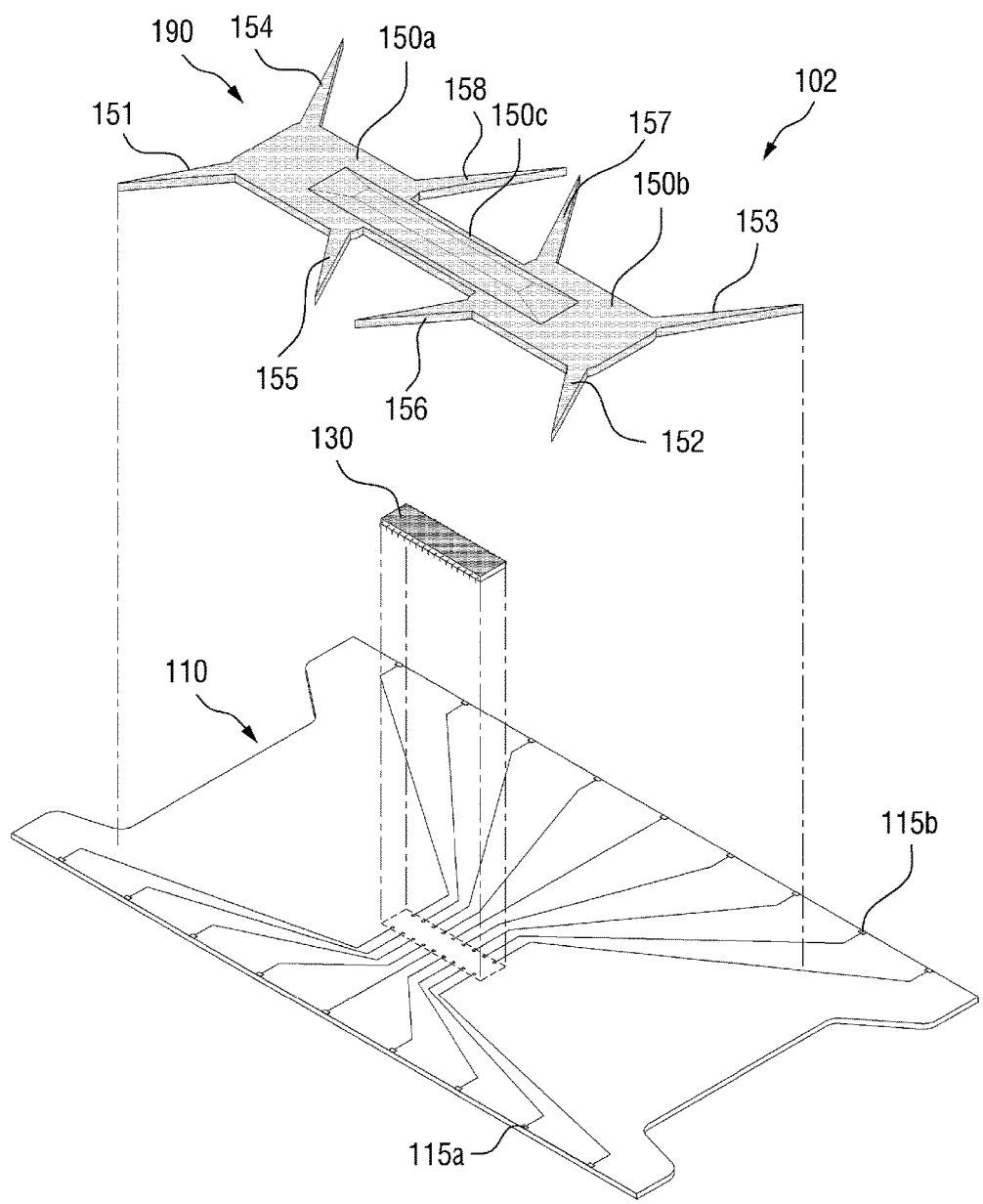
FIG. 10 is an exploded perspective of a chip-package according to yet another embodiment.
Figure 11:
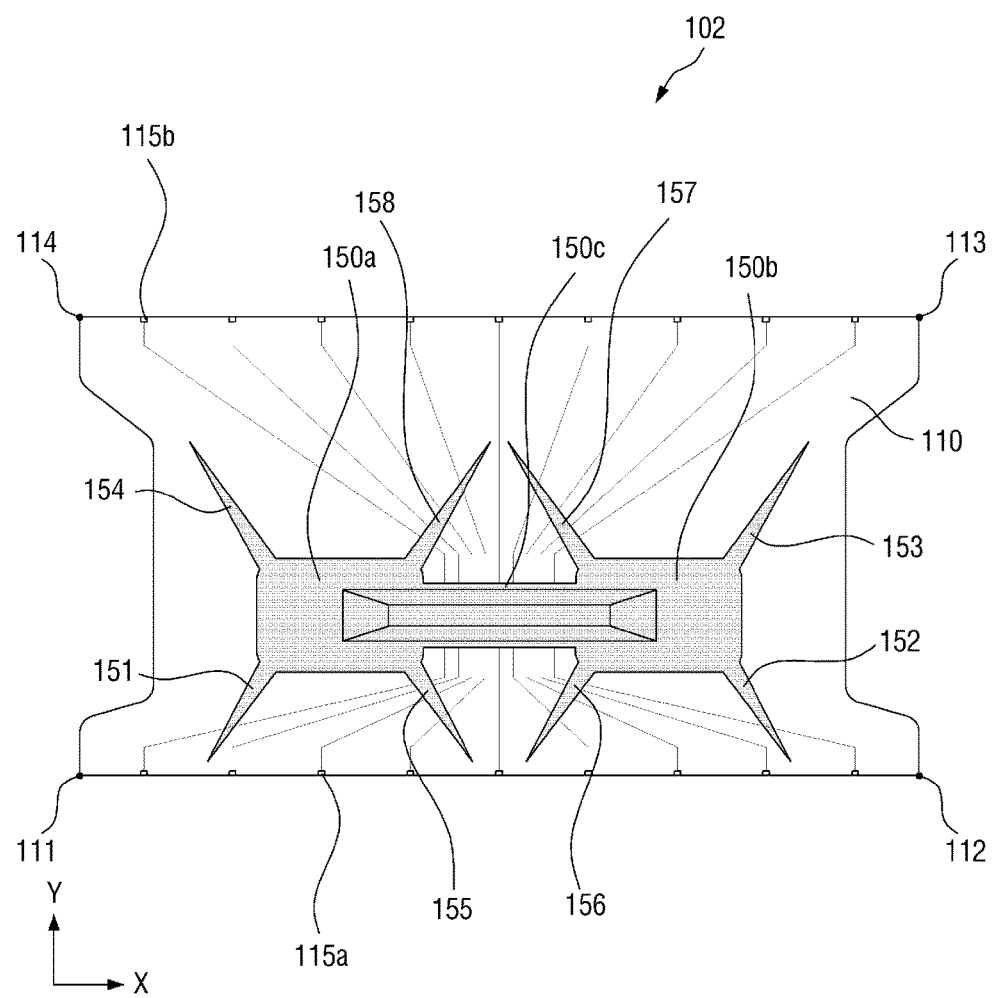
FIG. 11 is a plan view of the chip-on-film package of FIG. 10.

FIG. 10 is an exploded perspective view of a chip-on-film package 102 according to yet another embodiment. FIG. 11 is a plan view of the chip-on-film package 102 of FIG. 10.

Referring to FIGS. 10 and 11, the chip-on-film package 102 according to the current embodiment is different from the chip-on-film package 100 according to the embodiment of FIG. 3 in that a heat radiating member 190 further includes a fifth protrusion 155 extending from a first heat radiating pad portion 150a toward a second vertex 112 of a base film 110, a sixth protrusion 156 extending from a second heat radiating pad portion 150b toward a first vertex 111 of the base film 110, a seventh protrusion 157 extending from the second heat radiating pad portion 150b toward a fourth vertex 114 of the base film 110, and an eighth protrusion 158 extending from the first heat radiating pad portion 150a toward a third vertex 113 of the base film 110.

In an embodiment, an extension length of the fifth protrusion 155 may be smaller than an extension length of the eighth protrusion 158, and an extension length of the sixth protrusion 156 may be smaller than an extension length of the seventh protrusion 157. The extension length of the fifth protrusion 155 and the extension length of the sixth protrusion 156 may be substantially the same or different, and the extension length of the seventh protrusion 157 and the extension length of the eighth protrusion 158 may be substantially the same or different.

In some embodiments, an extension length of a first protrusion 151 may be the same as the extension length of the fifth protrusion 155, and an extension length of a second protrusion 152 may be the same as the extension length of the sixth projection 156. An extension length of a third protrusion 153 may be the same as the extension length of the seventh protrusion 157, and an extension length of a fourth protrusion 154 may be the same as the extension length of the eighth projection 158.

While the present inventive concept has been particularly illustrated and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A chip-on-film package comprising:
   a base film;
   a driving chip which is disposed on a surface of the base film; and
   a heat radiating member which is disposed on the driving chip and comprises a first heat radiating pad portion, a second heat radiating pad portion separated from the first heat radiating pad portion in a first direction, a connecting portion disposed between the first heat radiating pad portion and the second heat radiating pad portion, and one or more protrusions extending from the first heat radiating pad portion or the second heat radiating pad portion along an oblique direction in the first direction,
   wherein the connecting portion at least partially overlaps the driving chip,
   wherein the base film comprises:

a channel portion which overlaps the driving chip,
a first terminal portion which is disposed on a side of the channel portion in a second direction intersecting the first direction, and
a second terminal portion which is disposed on the other side of the channel portion in the second direction,
wherein the base film has a first vertex which is disposed on one side of the first terminal portion to be adjacent to the first heat radiating pad portion and a second vertex which is disposed on the other side of the first terminal portion to be adjacent to the second heat radiating pad portion, and
wherein the protrusions comprise a first protrusion which extends from the first heat radiating pad portion toward the first vertex of the base film, a second protrusion which extends from the second heat radiating pad portion toward the second vertex of the base film, a third protrusion which extends from the first heat radiating pad portion toward the second vertex of the base film and a fourth protrusion which extends from the second heat radiating pad portion toward the first vertex of the base film.

2. The chip-on-film package of claim 1,
wherein an extension length of the first protrusion is the same as an extension length of the second protrusion, and an extension length of the third protrusion is the same as an extension length of the fourth protrusion.

3. The chip-on-film package of claim 1, wherein the protrusions extends from the first heat radiating pad portion toward any vertex of the base film, and
an extension length of the protrusions is ⅓ or more of a length from the first heat radiating pad portion to the vertex of the base film.

4. The chip-on-film package of claim 3, wherein the extension length of the protrusions is greater than a width of the first heat radiating pad portion in the second direction.

5. The chip-on-film package of claim 1, wherein a width of the connecting portion in the second direction is greater than a width of the driving chip in the second direction.

6. The chip-on-film package of claim 5, wherein a width of the driving chip in the first direction is greater than the width of the driving chip in the second direction,
a length of the connecting portion in the first direction is smaller than the width of the driving chip in the first direction, and
the first heat radiating pad portion and the second heat radiating pad portion at least partially overlap the driving chip.

7. The chip-on-film package of claim 5, wherein a surface of the connecting portion is disposed at a level higher than a surface of the first heat radiating pad portion and a surface of the second heat radiating pad portion based on the surface of the base film.

8. The chip-on-film package of claim 7, wherein the surface of the connecting portion is partially inclined.

9. The chip-on-film package of claim 1, wherein the protrusion gradually becomes narrower as it extends.

10. The chip-on-film package of claim 5, wherein a length from the driving chip to an edge of the first terminal portion of the base film is smaller than a length from the driving chip to an edge of the second terminal portion of the base film.

11. The chip-on-film package of claim 10, wherein the protrusions comprise a first protrusion which extends from the first heat radiating pad portion toward the first terminal portion of the base film and a second protrusion which extends from the first heat radiating pad portion toward the second terminal portion of the base film,
wherein an extension length of the first protrusion is smaller than an extension length of the second protrusion.

12. The chip-on-film package of claim 1, further comprising an adhesive layer which is interposed between the driving chip and the heat radiating member, wherein the adhesive layer is in contact with the base film, the driving chip, and the heat radiating member.

13. A chip-on-film package comprising:
a base film;
a driving chip which is disposed on the base film; and
a metal plate which is disposed on the driving chip and comprises a first heat radiating pad portion, a second heat radiating pad portion separated from the first heat radiating pad portion in a first direction, a connecting portion disposed between the first heat radiating pad portion and the second heat radiating pad portion, and one or more protrusions extending from the first heat radiating pad portion or the second heat radiating pad portion along an oblique direction to the first direction,
wherein a width of the connecting portion in a second direction intersecting the first direction is smaller than a width of each of the first heat radiating pad portion and the second heat radiating portion in the second direction.

14. The chip-on-film package of claim 13, wherein an edge of the body portion has an inwardly recessed portion.

15. A display device comprising:
a display panel;
a printed circuit board on which a driving circuit for driving the display panel is mounted; and
a chip-on-film package which electrically connects the display panel and the printed circuit board,
wherein the chip-on-film package comprises:
a base film;
a driving chip which is disposed on a surface of the base film; and
a heat radiating member which is disposed on the driving chip and comprises a first heat radiating pad portion, a second heat radiating pad portion separated from the first heat radiating pad portion in a first direction, a connecting portion disposed between the first heat radiating pad portion and the second heat radiating pad portion, and one or more protrusions extending from the first heat radiating pad portion or the second heat radiating pad portion along an oblique direction to the first direction,
wherein the connecting portion at least partially overlaps the driving chip,
wherein the base film comprises:
a channel portion which overlaps the driving chip,
a first terminal portion which is disposed on a side of the channel portion in a second direction intersecting the first direction, and
a second terminal portion which is disposed on the other side of the channel portion in the second direction,
wherein the base film has a first vertex which is disposed on one side of the first terminal portion to be adjacent to the first heat radiating pad portion and a second vertex which is disposed on the other side of the first terminal portion to be adjacent to the second heat radiating pad portion, and
wherein the protrusions comprise a first protrusion which extends from the first heat radiating pad portion toward the first vertex of the base film and a second protrusion which extends from the second heat radiating pad portion toward the second vertex of the base film, a third protrusion which extends from the first heat radiating pad portion toward the second vertex of the base film and a fourth protrusion which extends from the second heat radiating pad portion toward the first vertex of the base film.

16. The display device of claim 15, wherein the base film comprises an input terminal portion which is connected to the printed circuit board and receives a driving signal from the driving circuit and an output terminal portion which is connected to the display panel and outputs the driving signal, and wherein the first protrusion extends from the first heat radiating pad portion body portion toward the input terminal portion of the base film and the second protrusion which extends from the second heat radiating pad portion toward the output terminal portion of the base film, and wherein an extension length of the first protrusion is smaller than an extension length of the second protrusion.

\* \* \* \* \*